United States Patent [19]

Steger et al.

[11] Patent Number: 5,494,523
[45] Date of Patent: Feb. 27, 1996

[54] CONTROLLING PLASMA PARTICULATES BY CONTOURING THE PLASMA SHEATH USING MATERIALS OF DIFFERING RF IMPEDANCES

[75] Inventors: Robert J. Steger, Cupertino; Charles S. Rhoades, Los Gatos; Anand Gupta, San Jose, all of Calif.

[73] Assignee: Applied Materials, Inc., Santa Clara, Calif.

[21] Appl. No.: 393,527

[22] Filed: Feb. 23, 1995

Related U.S. Application Data

[63] Continuation of Ser. No. 61,654, May 13, 1993, abandoned.
[51] Int. Cl.$^6$ .............................. H01L 21/00; C23C 1/00
[52] U.S. Cl. ..................... 118/723 E; 118/728; 156/345; 156/643.1; 204/192.12; 204/192.32; 204/298.15; 427/569
[58] Field of Search .................. 118/723 E, 728; 156/345, 643.1, 635.1, 646.1, 662.1; 427/569, 595; 204/298.02, 298.15, 298.31, 192.12, 192.32

[56] References Cited

U.S. PATENT DOCUMENTS

| | | | |
|---|---|---|---|
| 4,793,975 | 12/1988 | Drage | 156/345 X |
| 4,951,601 | 8/1990 | Maydan et al. | 118/719 |
| 5,137,610 | 8/1992 | Shumate et al. | 204/192.32 |
| 5,292,399 | 3/1994 | Lee et al. | 156/345 X |

FOREIGN PATENT DOCUMENTS

| | | | |
|---|---|---|---|
| 0272141 | 12/1987 | European Pat. Off. | H01L 21/00 |
| 0453780 | 3/1991 | European Pat. Off. | H01J 37/32 |
| 0425419A2 | 5/1991 | European Pat. Off. | |
| 62-47130 | 2/1987 | Japan . | |
| 62-047131 | 2/1987 | Japan | H01L 21/302 |

OTHER PUBLICATIONS

Koenig and Maissel, "Application of RF Discharges to Sputtering", IBM Journal of Research and Development, vol. 14, p. 168 (1970).

Selwyn et al., "In situ plasma contamination measurements by HeNe laser light scattering: A case study", Journal of Vacuum Science and Technology, vol. 8, No. 3, May/Jun. 1990.

Selwyn et al., "Particle trapping phenomena in radio frequency plasmas", Applied Physics Letter 57(18), Oct. 29, 1990.

Selwyn et al., "Rastered laser light scattering studies during plasma processing: Particle contaimination trapping pheonmena", Journal of Vacuum Science and Technology, vol. 9, No. 5, Sep./Oct. 1991.

Selwyn et al., "Plasma particulate contaimination control. II. Self-cleaning tool design", Journal of Vacuum Science and Technology, vol. 10, No. 4, Jul./Aug. 1992.

Gupta et al., U.S. Patent Application Ser. No. 07/899,539, Filed Jun. 16, 1992, entitled "Reducing Particle Contamination During Semiconductor Device Processing".

Gupta, U.S. Patent Application Ser. No. 07/980,828, filed Nov. 24, 1992, entitled "Reducing Particle Contamination During Semiconductor Device Processing".

Carlile, Robert N., et al., "Electrostatic Trapping of Contamination Particles in a Process Plasma Environment", Applied Physics Letters, vol. 59, No. 10, Sep. 2, 1991, pp. 1167–1169.

*Primary Examiner*—R. Bruce Breneman
*Assistant Examiner*—Joni Y. Chang
*Attorney, Agent, or Firm*—John P. Taylor

[57] ABSTRACT

A plasma processing apparatus including a wafer supporting pedestal which is designed to reduce particle trapping phenomena. In a region of the pedestal surface which surrounds or abuts the wafer, the pedestal has a permittivity which is substantially equal to or greater than that of the wafer surface. As a result, the sheath boundary is reshaped to reduce particle trapping.

4 Claims, 3 Drawing Sheets

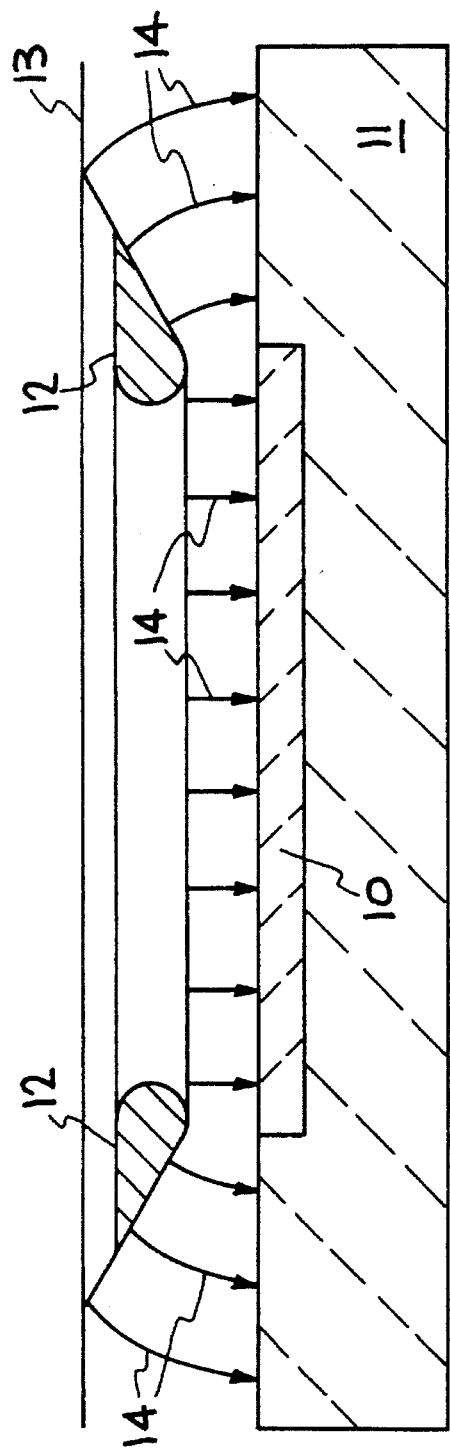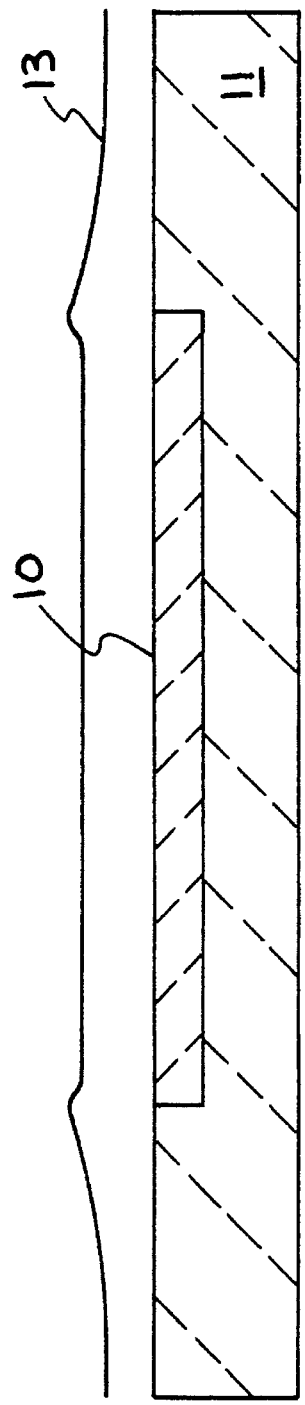
FIG. 2 (PRIOR ART)
FIG. 3

CONTROLLING PLASMA PARTICULATES BY CONTOURING THE PLASMA SHEATH USING MATERIALS OF DIFFERING RF IMPEDANCES

CROSS-REFERENCE TO RELATED APPLICATIONS

This application is a File Wrapper Continuation Application of U.S. patent application Ser. No. 08/061,654, filed May 13, 1993, abandoned.

BACKGROUND OF THE INVENTION

This application relates to control of contaminating particles in materials processing.

In a sputter or reactive ion etching or chemical vapor deposition apparatus used in semiconductor manufacturing, a semiconductor wafer is placed between two electrodes which are driven by a radio frequency (RF) AC voltage source. (Ordinarily the wafer is placed directly over one electrode and a substantial distance from the other electrode.) A reactant gas is released into the chamber in the area above the wafer. Because the reactant molecules are relatively large and immobile, they cannot move in response to the rapidly fluctuating electric fields. However, the electrons associated with the reactant molecules are relatively mobile. As a result, if the AC electric fields are sufficiently intense, electrons are stripped from the reactant molecules, forming a gas plasma of free electrons and positive reactant ions. This plasma is highly conductive because it contains a large number of free carriers, and therefore is essentially an equipotential region.

Ions have a much larger mass than electrons; in fact, ions are so massive that they are essentially unaffected by the RF AC electric fields; however, due to their smaller mass, free electrons are rapidly accelerated by the RF AC electric fields. Note, however, that because the plasma is an equipotential region, electrons within the plasma are not influenced by the RF AC electric fields; only those which reach the edge of the region between the plasma and the wafer—the "plasma sheath"—are accelerated.

When the RF AC source is first turned on, the wafer and electrode surfaces contain no charge. In the first half of the AC cycle the electrode immediately underneath the wafer has a positive voltage, and the wafer surface attracts electrons and repels ions. During this half of the cycle, electrons are accelerated from the sheath onto the wafer, where they join other electrons in one of the energy bands of the wafer's semiconductor material. In the second half of the AC cycle, the electrode underneath the wafer has a negative voltage, which attracts positive ions toward the wafer and repels electrons. However, relatively few of the electrons on the wafer develop the necessary energy to leave the energy bands of the wafer and return to a free energy state within the plasma. Thus, during the first and subsequent AC cycles, electrons are collected on the wafer surface.

This accumulation of negative charge causes the wafer to "self bias" to a negative DC voltage relative to the plasma, creating a DC electric field in the sheath. Although the ions in the sheath are unaffected by the AC fields, they are accelerated toward the wafer by these DC fields, resulting in a DC flow of ions onto the wafer surface. At the same time, as the self bias voltage builds, during a larger part of the AC cycle the wafer voltage is more negative than the plasma, reducing the time during which electrons are attracted to the wafer. Ultimately, the wafer charges to a negative voltage nearly equal to the peak voltage of the AC signal, and the system reaches a steady state in which an equal number of positive ions and electrons strike the wafer during each AC signal period. The flow of ions is relatively steady throughout the cycle, and is equalized by a brief spike of electron flow during the peak portion of the AC cycle.

Particle contamination is becoming an increasingly serious limitation in high quality materials processing such as semiconductor manufacturing. In the semiconductor manufacturing area, it has been estimated that as much as 70–80% of all wafer contamination is caused by particles. Thus, substantial reductions in defect rates may be achieved by reductions in particle contamination.

A typical plasma apparatus includes many potential sources of contaminating particles, such as: cracked or flaking materials (e.g., quartz) or films (e.g., dielectric films) inside the chamber, polymers collecting on the walls of the chamber over time, small metal spheres created by arcing between metal surfaces, and incidental contact or rubbing inside the chamber during wafer handling. Once particles from any of these sources are released into the processing chamber during processing, they enter the gas plasma, and ultimately land on and contaminate the wafer surface.

Because free electrons within the plasma have a much higher mobility than positive ions, particles entering the plasma are bombarded with more electrons than ions, and build up a negative surface charge. Gravitational forces pull the particles down in the direction of the wafer, but once the particles reach the plasma sheath, the strong DC electric field between the plasma and the negatively charged wafer overcomes the downward gravitational force, and as a result the particles float at the plasma sheath boundary. However, when the RF power is turned off, the negative charge on the wafer dissipates, and any particles at the sheath boundary fall onto and contaminate the wafer 10.

Selwyn, "Particle trapping phenomena in radio frequency plasmas" (*Applied Physics Letter* 57, Oct. 29, 1990) photographed particles floating above wafers using scattered laser light. As illustrated in FIGS. 1A and 1B, Selwyn discovered that when the wafer 10 is inserted into a recess of a graphite electrode 11, levitating particles tend to trap above the wafer, forming a cloud over the wafer in the shape of a ring 12 approximately above the outer edge of the wafer.

Selwyn, "Plasma particulate contamination control II. Self-cleaning tool design" (*Journal of Vacuum Science and Technology*, 10(4), July/August, 1992) discusses this effect and shows that the trapping phenomenon can be reduced by grooving electrode 11. The groove creates a channel in the sheath leading away from outer ring 12 and toward the vacuum inlet port. Particles that would have been trapped in the outer ring 12 follow this channel, thus reducing the number of particles in the area above the wafer.

SUMMARY OF THE INVENTION

In one aspect, the invention features a plasma processing chamber for processing a surface of a wafer. The wafer is supported on the surface of a pedestal within the chamber, such that an RF electrical source connected between the pedestal surface and the chamber generates a plasma above the wafer. To reduce particle trapping, a region in the pedestal surface adjoining the wafer has a permittivity substantially equal to or greater than that of the surface of the wafer.

In preferred embodiments, the wafer is a disk-shaped silicon wafer, and the high-permittivity region is an annular ring which fully surrounds the wafer. Where the pedestal is made of a low-permittivity material, the invention may be implemented by shrouding the top surface of the pedestal with a cover manufactured of high-permittivity material, particularly where the chamber design uses a shadow ring cover which extends above the surface of the wafer. To prevent contamination caused by this high-permittivity material, it may be overlaid by an epitaxial layer of inert material.

Other aspects include methods of reducing particle trapping in wafer processing by adjoining the wafer to a region having a permittivity substantially equal to or greater than that of the surface of the wafer.

BRIEF DESCRIPTION OF THE DRAWING

FIG. 2 shows the sheath contours which cause particle trapping.

FIG. 3 is a diagrammatic view of a cavity with reduced particle trapping.

DESCRIPTION OF THE PREFERRED EMBODIMENTS

Figure 1A:
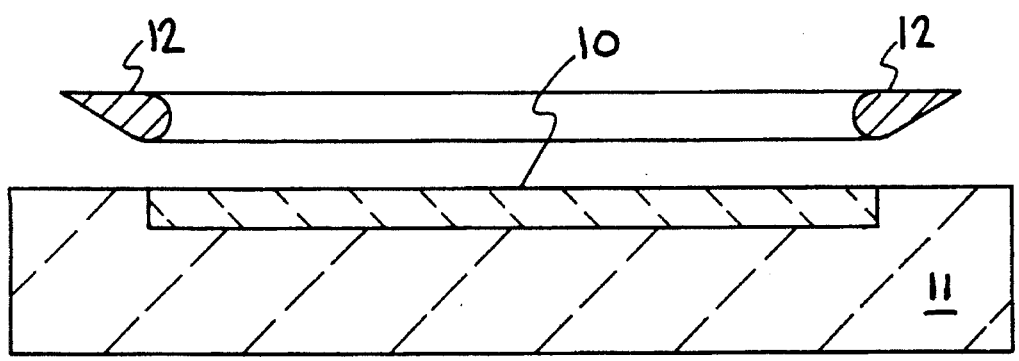
FIGS. 1A and 1B are cross-sectional and perspective views, respectively, of a wafer 10 in an electrode 11, showing clouds of particles which trap above the wafer.
Figure 1B:
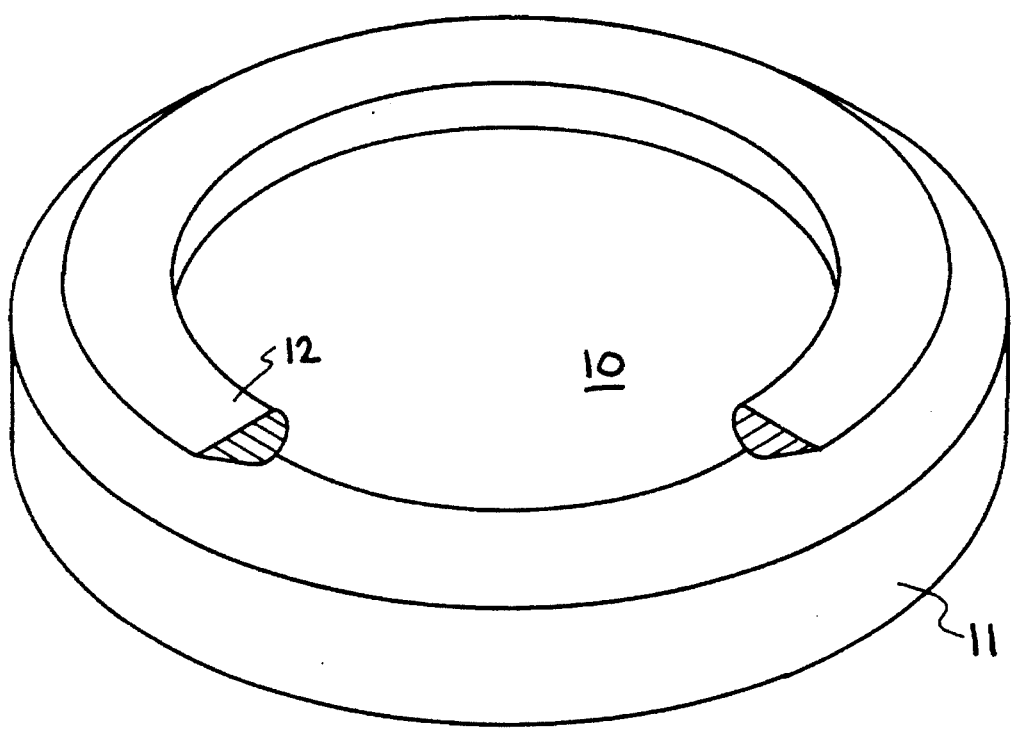

The invention is based on the following theoretical analysis of the particle-trapping phenomenon.

The current density through the plasma (and therefore the deposition rate) is determined by the RF impedance of the surface of the wafer and of the surrounding electrode. The RF impedance is, in turn, a function of the permittivity $\epsilon$ of the wafer and electrode surfaces. In typical configurations, the wafer is silicon and the surrounding electrode is an inert material such as quartz (to prevent contamination). Silicon has a relatively high permittivity of approximately $11.8 \cdot \epsilon_0$, whereas quartz has a moderate permittivity of approximately $3.8 \cdot \epsilon_0$. Thus, the surface of the silicon wafer has a lower RF impedance than the surrounding material, and as a result there is substantially higher current flow between the plasma and wafer than between the plasma and the surrounding material.

For most purposes it would be preferred to design the chamber in the manner described above, i.e. so that the wafer was surrounded with low permittivity materials. This is so because the deposition rate is directly related to current flow, and therefore it is preferred to concentrate current flow at the wafer surface to avoid unwanted deposition on other chamber surfaces.

However, as shown below, the current flow is also related to the sheath thickness; as a result, surrounding the wafer with low permittivity materials creates a "well" in the sheath in the area above the wafer, enhancing the particle-trapping phenomena described in the above-referenced Selwyn papers.

While the plasma is active, the sheath between the plasma and wafer forms a thermionic diode. The current flowing through this diode is given by the Child-Langmuir equation:

$$J = \frac{KV^{3/2}}{\sqrt{m} \ D^2}$$

where J is the current density, V is the voltage drop across the sheath, m is the ion mass, D is the thickness of the sheath, and K is a constant. The Child-Langmuir equation demonstrates that the sheath thickness at a given location varies inversely with the current density at that location. (Further details of this portion of the analysis may be found in H. Koenig and H. I. Meissel, IBM Journal of Research and Development, Vol. 14, page 168 (1970).)

FIG. 2 illustrates the resulting cross-sectional contour of the sheath thickness. Above the wafer 10, which has a relatively high permittivity and current density, the sheath is relatively thin, and the sheath-plasma boundary 13 is relatively close to the wafer surface. However, in the area surrounding the wafer, which has a relatively low permittivity and current density, the sheath is relatively thick, and the sheath-plasma boundary 13 is further away from the surface.

As a result, an electropotential "well" forms in the sheath boundary above the wafer. This well traps particles because, at the edges of the electropotential "well", the electric fields in the sheath (represented by lines 14) have a radially inward-directed component. (This is because electric field lines are always perpendicular to equipotential lines.) Thus, particles floating at the sheath boundary (due to balancing electrostatic and gravitational forces) are repelled from the edges of the "well" toward the center. This radially-inward electrostatic force is balanced by the electrostatic repulsion of the particles from each other, leading to the formation of a ring 12 (or multiple concentric rings) of particles within the well.

FIG. 3 illustrates a plasma cavity designed to reduce this particle trapping phenomena. A material having a relatively high permittivity (approximately equal to or greater than that of the wafer) is used in the area surrounding the wafer. As a result, the thickness of the sheath in the area surrounding the wafer is equal to or less than it is above the wafer itself, eliminating the "well" illustrated in FIG. 2. Particles are no longer trapped above the wafer and may be more easily removed from the chamber.

One aspect of this technique is that it increases the rate of unwanted deposition in the area surrounding the wafer. However, it is expected that this technique will achieve a reduction in defect rates which more than compensates for any additional cleaning or replacement costs necessitated by unwanted deposition.

Figure 4:
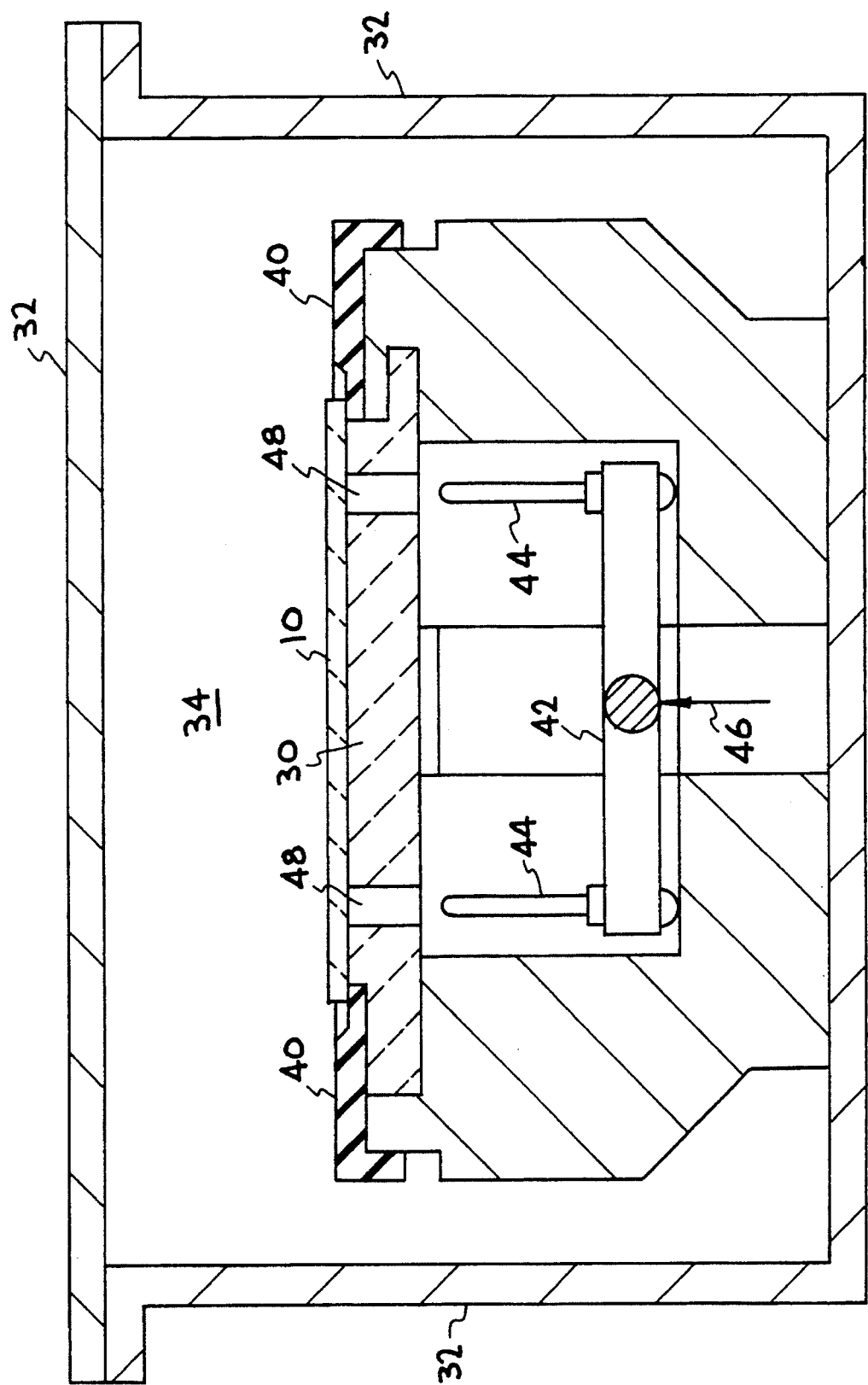
FIG. 4 is a cross-sectional view of a wafer processing cavity with reduced particle trapping.

A cross-section of a chamber suitable for implementing the above technique is shown in FIG. 4. The wafer 10 sits atop a pedestal 30. Pedestal 30 and chamber walls 32 are coupled to an RF power source (not shown) which, when operating, generates high-frequency electric fields in the area 34 between the pedestal 30 and the walls 32 of the chamber. As described above, during wafer processing these fields cause a gas plasma to form in area 34, leading to accumulation of ions on the face of the wafer exposed to the plasma.

The upper pedestal surface is covered by an electrically insulating cover 40, shown in cross-section in FIG. 4. The cover 40 is an annular disk; it forms a flat ring around the outside of the wafer and supports the edges of the wafer.

Cover 40 is manufactured of a material having a permittivity approximately equal to or greater than that of the wafer.

One alternative is to manufacture the cover 40 of a material having a permittivity approximately equal to that of silicon, for example a high-permittivity ceramic (some ceramics have a relative permittivity as high as 11). Although the permittivity of the cover 40 is slightly less than that of silicon, because it is approximately equal to that of silicon, the resulting equipotential well will be substantially shallower than that created by cover materials such as quartz (relative permittivity of 3.8). Because the well is shallow, particles (which are randomly agitated by gas flow and collisions with each other) will be far less likely to remain trapped within the well. As long as the relative permittivity of the cover is approximately equal to that of silicon, for example greater than 10, particle trapping above the wafer will be substantially reduced.

Another alternative is to manufacture the cover 40 of the same material as the wafer, so that the cover has the same permittivity as the wafer, eliminating the potential well. This alternative would also substantially reduce particle trapping above the wafer.

A more aggressive alternative is to manufacture the cover 40 of a material with a permittivity substantially higher than that of silicon, thereby turning the equipotential well illustrated in FIG. 4 into an equipotential "hill" which creates radially outward electrostatic forces, driving particles away from the area above the wafer. There are several materials which have a relative permittivity greater than that of silicon. For example, tantalum pentoxide has a relative permittivity of approximately 25, and titanium oxide has a relative permittivity of approximately 100. A potential difficulty with these metals, however, is the possibility of heavy metal contamination caused by etching on the ring 40. These difficulties are most likely to occur when fluorine ($F^-$) or Chlorine ($Cl^-$) ions are present in the chamber; processes which use relatively inert gasses are less likely to have these difficulties. In either application, however, possible contamination by the cover material may be avoidable by overlaying the cover with an epitaxial layer of inert material such as quartz. This layer should be thin enough that it does not substantially affect the permittivity of the cover.

In some processing chambers, the cover 40 includes a "shadow ring", which extends above the surface of the wafer. The inner perimeter of the shadow ring overlies the edges of the wafer, and thereby clamps the wafer to the pedestal (to prevent unwanted deposition on the side contacting the pedestal). Shadow rings are often manufactured of conductive metals such as anodized aluminum, or low permittivity materials such as ceramic, or both. Because the shadow ring extends above the surface of the wafer, and typically is constructed of conductive and/or low permittivity materials, the shadow ring typically enhances the upward distortion of the plasma/sheath boundary at the edges of the wafer, and thereby increases particle trapping. However, by manufacturing the shadow ring of high-permittivity, non-conductive materials in the manner discussed above, this effect can be mitigated.

Also shown in FIG. 4 is a lifting apparatus which is used to raise and lower the wafer 10 from and to the position shown in FIG. 4. The lifting apparatus includes crossbars such as 42 connected between lifting pins 44 (there are two crossbars and four lifting pins; one crossbar and two lifting pins are shown in outline in FIG. 4). When the crossbars 42 are raised in the direction of arrow 46, the lifting pins pass through apertures 48 in the pedestal 30, engage the underside of the wafer, and lift the wafer above the pedestal so that, e.g., it can be gripped and moved by a robot arm. (One robotic apparatus for moving wafers during sequential processing is described in U.S. Pat. No. 4,951,601 of Maydan et al., which is entitled "Multi-Chamber Integrated Process System", and is assigned to the assignee of this application).

This invention has been disclosed with reference to a specific embodiment; however, various modifications to the embodiments described herein may be undertaken by those skilled in the art without departing from the disclosed inventive concepts. For example, the high-permittivity region need not fully surround the wafer; if a high-permittivity region abuts any edge of the wafer, it will form a channel in the sheath leading away from the equipotential well, through which particles can be evacuated from the area above the wafer.

What is claimed is:

1. A plasma processing apparatus for processing a wafer surface comprising:

a) a vacuum chamber;

b) a pedestal including a pedestal cover within said vacuum chamber, said pedestal having a surface for supporting said wafer; and c) an RF electrical source connected between said pedestal surface and said chamber to generate a plasma within said chamber in a region above said wafer surface;

wherein, in a region of said pedestal which adjoins an edge of said wafer, said pedestal surface has a permittivity equal to or greater than a permittivity of said wafer surface, and said pedestal cover further comprises a shadow ring which extends above said wafer surface, said shadow ring having a permittivity equal to or greater than said permittivity of said wafer surface.

2. A plasma processing apparatus for processing a wafer surface comprising:

a) a vacuum chamber;

b) a pedestal including a pedestal cover within said vacuum chamber, said pedestal having a surface for supporting said wafer; and c) an RF electrical source connected between said pedestal surface and said chamber to generate a plasma within said chamber in a region above said wafer surface;

wherein, in a region of said pedestal which adjoins an edge of said wafer, said pedestal surface has a permittivity equal to or greater than a permittivity of said wafer surface, and said pedestal cover further comprises an epitaxial layer of inert material overlying said pedestal surface having a permittivity equal to or greater than said permittivity of said wafer surface.

3. A method of processing a wafer surface comprising:

a) supporting said wafer on a surface of a pedestal including a pedestal cover in a vacuum chamber; and b) applying an RF electrical source between said pedestal surface and said chamber to generate a plasma within said chamber in an area above said wafer surface;

wherein, in a region of said pedestal which adjoins an edge of said wafer, said pedestal surface has a permittivity equal to or greater than a permittivity of said wafer surface, and said pedestal cover further comprises a shadow ting which extends above said wafer surface, said shadow ring having a permittivity equal to or greater than said permittivity of said wafer surface.

4. A method of processing a wafer surface comprising:
 a) supporting said wafer on a surface of a pedestal including a pedestal cover in a vacuum chamber; and
 b) applying an RF electrical source between said pedestal surface and said chamber to generate a plasma within said chamber in an area above said wafer surface;
 wherein, in a region of said pedestal which adjoins an edge of said wafer, said pedestal surface has a permittivity equal to or greater than a permittivity of said wafer surface, and said pedestal cover further comprises an epitaxial layer of inert material overlying said pedestal surface having a permittivity equal to or greater than said permittivity of said wafer surface.

* * * * *